(12) United States Patent
Flaster et al.

(10) Patent No.: US 12,152,858 B2
(45) Date of Patent: Nov. 26, 2024

(54) AIMING DEVICE FOR A FIREARM

(71) Applicant: JM ACQUISITIONS INC, Cheyenne, WY (US)

(72) Inventors: Jonathan K. Flaster, San Diego, CA (US); Stephen J. Mencanin, Aliso Viejo, CA (US); Timothy M. Langan, Mission Viejo, CA (US); Adam D. Flaster, Tempe, AZ (US)

(73) Assignee: JM ACQUISITIONS INC, Cheyenne, WY (US)

( * ) Notice: Subject to any disclaimer, the term of this patent is extended or adjusted under 35 U.S.C. 154(b) by 583 days.

(21) Appl. No.: 17/492,939

(22) Filed: Oct. 4, 2021

(65) Prior Publication Data

US 2022/0018632 A1     Jan. 20, 2022

Related U.S. Application Data

(63) Continuation-in-part of application No. 16/382,853, filed on Apr. 12, 2019, now abandoned, which is a continuation of application No. 14/757,706, filed on Dec. 23, 2015, now abandoned.

(60) Provisional application No. 62/096,108, filed on Dec. 23, 2014.

(51) Int. Cl.
| | |
|---|---|
| *G02B 27/30* | (2006.01) |
| *F41G 1/35* | (2006.01) |
| *G02B 26/00* | (2006.01) |
| *H01S 5/00* | (2006.01) |
| *H01S 5/40* | (2006.01) |

(52) U.S. Cl.
CPC .............. *F41G 1/35* (2013.01); *G02B 26/007* (2013.01); *G02B 27/30* (2013.01); *H01S 5/005* (2013.01); *H01S 5/4087* (2013.01)

(58) Field of Classification Search
CPC ...... G02B 23/00; G02B 23/105; G02B 23/16; F41G 1/00; F41G 1/32; F41G 1/34; F41G 1/345; F41G 1/35; F41G 1/36; F41G 1/38; F41G 1/41; F41G 1/42; F41G 3/00; F41G 3/065; F41G 3/145; F41G 3/26; F41G 3/2616
USPC ......................................... 359/399–435, 641
See application file for complete search history.

(56) References Cited

U.S. PATENT DOCUMENTS

| | | |
|---|---|---|
| 4,300,156 A | 11/1981 | Boyd |
| 4,852,985 A | 8/1989 | Fujhara |
| 5,426,533 A | 6/1995 | Wallace |
| 5,491,546 A | 2/1996 | Wascher et al. |

(Continued)

*Primary Examiner* — Thong Q Nguyen
(74) *Attorney, Agent, or Firm* — SoCal IP Law Group LLP; Steven C. Sereboff (57) ABSTRACT

There are disclosed aiming and target identification devices useful with firearms. One device includes a laser diode capable of emitting visible, infrared or ultraviolet light at the operator's selection to form a laser using a single or compound collimator. A single collimator can be repositioned at different distances from the laser source to ensure proper positioning to create a laser beam for the particular wavelength of light emitted from the laser diode. A compound collimator could have different collimating regions and be configured to rotate to cause the different collimating regions to receive light emitted from the laser source such that different light wavelengths are properly collimated without needing to alter the distance from the collimator to the laser diode.

10 Claims, 10 Drawing Sheets

(56) References Cited

U.S. PATENT DOCUMENTS

| | | |
|---|---|---|
| 5,671,561 A | 9/1997 | Johnson et al. |
| 6,829,400 B2 | 12/2004 | Nakano |
| 6,956,322 B2 | 10/2005 | Ikeda |
| 7,068,699 B2 | 6/2006 | Nettleton et al. |
| 7,072,103 B1 | 7/2006 | Atchlson |
| 7,376,116 B2 | 5/2008 | Rozenblit |
| 7,376,165 B2 | 5/2008 | Downing |
| 7,486,712 B2 | 2/2009 | Hata |
| 8,130,368 B2 | 3/2012 | Eno |
| 10,655,934 B2 * | 5/2020 | Flaster ............... F41G 1/35 |
| 2002/0064192 A1 | 5/2002 | Missey |
| 2007/0019702 A1 | 1/2007 | Day |
| 2008/0205249 A1 | 8/2008 | Bae |
| 2008/0231803 A1 | 9/2008 | Feldon |
| 2009/0040754 A1 | 2/2009 | Brukilacchino |
| 2009/0223072 A1 | 9/2009 | Morin |
| 2010/0002560 A1 | 1/2010 | Yamasaki |
| 2012/0292531 A1 | 11/2012 | Grudlinin |
| 2013/0050838 A1 | 2/2013 | Nagano |
| 2013/0235609 A1 | 9/2013 | Nemeyer |

* cited by examiner

AIMING DEVICE FOR A FIREARM

RELATED APPLICATION INFORMATION

This patent is a continuation-in-part of the following patent applications: application Ser. No. 16/382,853 filed Apr. 12, 2019, now abandoned, which is a continuation of application Ser. No. 14/757,706 filed Dec. 23, 2015, now abandoned, which claims priority from Application No. 62/096,108 filed Dec. 23, 2014. This patent is related to application Ser. No. 15/981,815 filed May 16, 2018, now U.S. Pat. No. 10,655,934, which also claims priority from Application No. 62/096,108, the contents of which are expressly incorporated herein by reference.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

STATEMENT REGARDING FEDERALLY SPONSORED RESEARCH OR DEVELOPMENT

Not applicable.

THE NAMES OF THE PARTIES TO A JOINT RESEARCH AGREEMENT

Not applicable.

INCORPORATION-BY-REFERENCE OF MATERIAL SUBMITTED ON A READ-ONLY

Not applicable.

OPTICAL DISC, AS A TEXT FILE ORAN XML FILE VIA THE PATENT ELECTRONIC SYSTEM

Not applicable.

STATEMENT REGARDING PRIOR DISCLOSURES BY THE INVENTOR OR A JOINT INVENTOR

Not applicable.

BACKGROUND

Field

This disclosure relates to aiming devices, such as those used with firearms.

Description of the Related Art

Laser aiming devices for firearms are known. A firearm is a barreled ranged weapon that inflicts damage on targets by launching one or more projectiles driven by rapidly expanding high-pressure gas produced by exothermic combustion (deflagration) of a chemical propellant. Firearms are designed to be readily carried and used by an individual, such as a rifle or a pistol.

Typical laser aiming devices emit either visible green light, visible red light or infrared light. Visible light, i.e., light to which a typical human eye will respond, is defined as wavelengths from 380 nm (i.e., purple) to 750 nm (red). Infrared light, defined as wavelengths from 700 nm to 1 mm, is not visible to a typical human eye, but can be seen using night vision goggles or other infrared converters.

SUMMARY OF THE INVENTION

An aiming device for a firearm is disclosed. The aiming device has a housing adapted to be affixed to the firearm.

The aiming device has a package affixed in the housing, The package comprises three separate light emitters. The light emitters are configured to emit light along an optical axis in alignment with a bore axis of a barrel of the firearm. The first light emitter is configured to emit visible light. The second light emitter is configured to emit infrared light. The third light emitter is configured to emit ultraviolet light. Only one of the light emitters generates light at a time.

The aiming device has a collimator affixed in the housing. The collimator is configured to collimate the visible light at a first distance from a point on the package. The collimator is configured to collimate the infrared light at a second distance from the point. The collimator is configured to collimate the ultraviolet light at a third distance from the point. The collimator causes the visible light to be collimated into a first laser at the first distance passing through the collimator. The collimator causes the infrared light to be collimated into a second laser at a second distance passing through the collimator. The collimator causes the ultraviolet light to be collimated into a third laser at a third distance passing through the collimator.

The aiming device has a positioner to position the collimator under operator control at any one of a first position, a second position and a third position. The first position corresponds to the first distance. The second position corresponds to the second distance. The third position corresponds to the third distance.

The light emitters and the collimator are adapted such that the first light emitter generates the visible light when the compound collimator is in the first position. The light emitters and the collimator are adapted such that the second light emitter generates the infrared light when the compound collimator is in second position. The light emitters and the collimator are adapted such that the third light emitter generates the ultraviolet light when the compound collimator is in the third position.

Throughout this description, elements appearing in figures are assigned three-digit reference designators, where the most significant digit is the FIG. number and the two least significant digits are specific to the element. An element that is not described in conjunction with a FIG. may be presumed to have the same characteristics and function as a previously-described element having a reference designator with the same least significant digits.

DETAILED DESCRIPTION

An aiming and target identification device for a firearm is disclosed herein including a laser diode and a compound collimator. The laser diode can generate an electromagnetic emission that has one, two, three, or more different wavelengths (e.g., visible light, ultraviolet light, infrared light, x-rays, gamma rays, radio waves). The compound collimator is made up of two or more collimators, where each collimator may be configured to collimate different wavelength emissions from the laser diode.

The collimators on the compound collimator may be configured such that the focal length for each wavelength of electromagnetic radiation (EMR) emitted by the laser diode is the same. In these embodiments, to change between focusing different wavelengths of EMR emitted from the laser diode, the compound collimator can rotate about a central axis to activate different collimators disposed on the compound collimator. To facilitate rotation, the laser device can additionally include a rotating mechanism that causes the compound collimator to rotate about the axis of rotation (e.g., an electronic motor such as a stepper motor) in response to a trigger.

In embodiments having a compound collimator, each collimator disposed on the compound collimator can be equidistant from the axis of rotation. In other embodiments, each collimator's position on the compound collimator can be located at a different radial location to compensate for slightly different locations of each wavelength's true emission location (because although small, the laser diode in some embodiments can include two, three, or more diodes that each emit EMR from slightly different non-overlapping locations).

In embodiments having a compound collimator, the laser diode can emit different wavelengths of EMR depending on the position that the compound collimator is in. For example, if the compound collimator is in a first angular position, then the laser diode can emit visible light. If the compound collimator is moved to a second angular position, then the laser diode can emit ultraviolet light. In a third angular position, the laser diode can emit infrared light. In some embodiments, the laser device can additionally include a locking mechanism for lock locking the compound collimator into the different angular positions.

The device may include a laser diode and a collimator. The laser diode generates an emission of at least two wavelengths of EMR. The collimator can collimate the emissions from the laser diode as a function of its position (e.g. distance from the laser diode). By placing the collimator at a distance from the laser diode based on the focal length of the particular laser diode emission, a single collimator can be implemented for the laser device.

The device may include a positioning mechanism to facilitate positioning the collimator at the different positions required to focus the different wavelength EMR emissions from the laser diode (e.g., at a first, second, and third position for laser diodes capable of emitting three different wavelength of EMR). The positioning mechanism can include detents that lock, or otherwise hold the collimator in place relative to the laser diode, at the various distances from the laser diode.

In some embodiments, the laser diode can be configured to emit a first wavelength of EMR when the collimator is in a first position and automatically switch to a second wavelength of EMR when the collimator is in a second position. To facilitate switching the collimator from position to position along the positioning mechanism, the laser device can additionally include a motor and control system that moves the collimator in response to a triggering mechanism.

Identifying a target using the device include: (1) activating a laser diode that generates an emission of EMR (e.g., a laser diode that generates one, two, three or more different wavelengths of EMR, such as visible light, ultraviolet light, and infrared light or any combination thereof); (2) positioning a collimator at a distance from the laser diode; (3) using the collimator to collimate the emission; and (4) target identification the collimated emission at the target.

In some embodiments, the method additionally includes the step of positioning the collimator at another distance from the laser diode.

In other embodiments, the collimator remains at a fixed distance from the laser diode and it includes multiple collimating regions (e.g., multiple collimators in the form of a compound collimator as described above). In embodiments that include a compound collimator, the method could comprise the step of rotating the compound collimator from a first angular position to a second angular position instead of, or in addition to, moving the collimator to different distances relative to the laser diode. When the compound collimator is in the first angular position, the first type of emission from the laser diode is received by a first collimating region, and when the compound collimator is in the second angular position, the second type of emission from the laser diode is received by the second collimating region.

Figure 1:
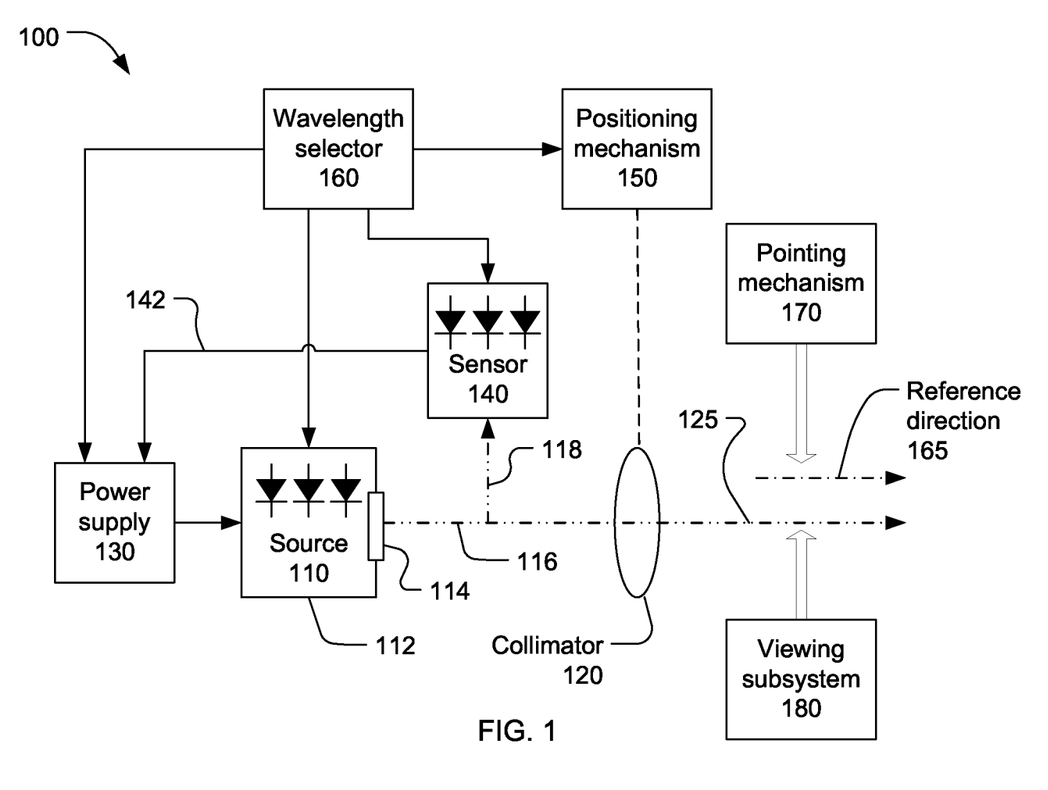
FIG. 1 is a functional block diagram of an aiming and target identification military device.

FIG. 1 is a functional block diagram of a laser device 100. The laser device 100 includes a laser diode 110 capable of emitting three different wavelengths of light, a collimator 120, a power supply 130, a positioning mechanism 150, and a wavelength selector 160. The laser device 100 may also include a sensor 140, a pointing mechanism 170, and a viewing subsystem 180.

The laser diode 110 includes at least three solid-state light emitters integrated within a single package 112. The three solid-state light emitters may be laser diodes, light emitting diodes, or other solid state sources. The three solid-state light emitters may be fabricated on two or three separate semiconductor substrates or chips that may then be integrated within the package 112. For example, two or three semiconductor substrates may be stacked within the package 112 as described in U.S. Pat. Nos. 6,956,322, 7,376,116, or 7,486,712. The package 112 may be, for example, a metal can with a transparent window as illustrated in each of these patents. The package 112 may be a ceramic, metal, or plastic enclosure of some other shape. Package 112 has a transparent window 114 to allow light emitted from the three solid state light emitters to exit the package. While package 112 has at least two electrical terminals to allow power to be supplied to the light emitters, package 112 has at least four electrical terminals to allow power to be supplied independently to each of the light emitters. Using separate electrical terminals allows the power supply to easily turn on and off the light emitters as a function of the wavelength selector.

One of the three light emitters within the laser diode 110 could be configured to emit optical energy at an invisible infrared wavelength. Another of the three light emitters could be configured to emit light at a visible wavelength, which is typically red or green. The third of the three light emitters could be configured to emit light at an invisible ultraviolet wavelength (i.e., a wavelength less than 380 nm) or a barely-visible violet wavelength (i.e., a wavelength between 380 and 420 nm).

The light from all three light emitters within the laser diode 110 may be configured to emanate from a common point within the package. The wide difference in wavelength of the three light emitters may dictate that each light emitter be fabricated on a separate semiconductor chip which may then be mounted within the common package 112.

Figure 2:
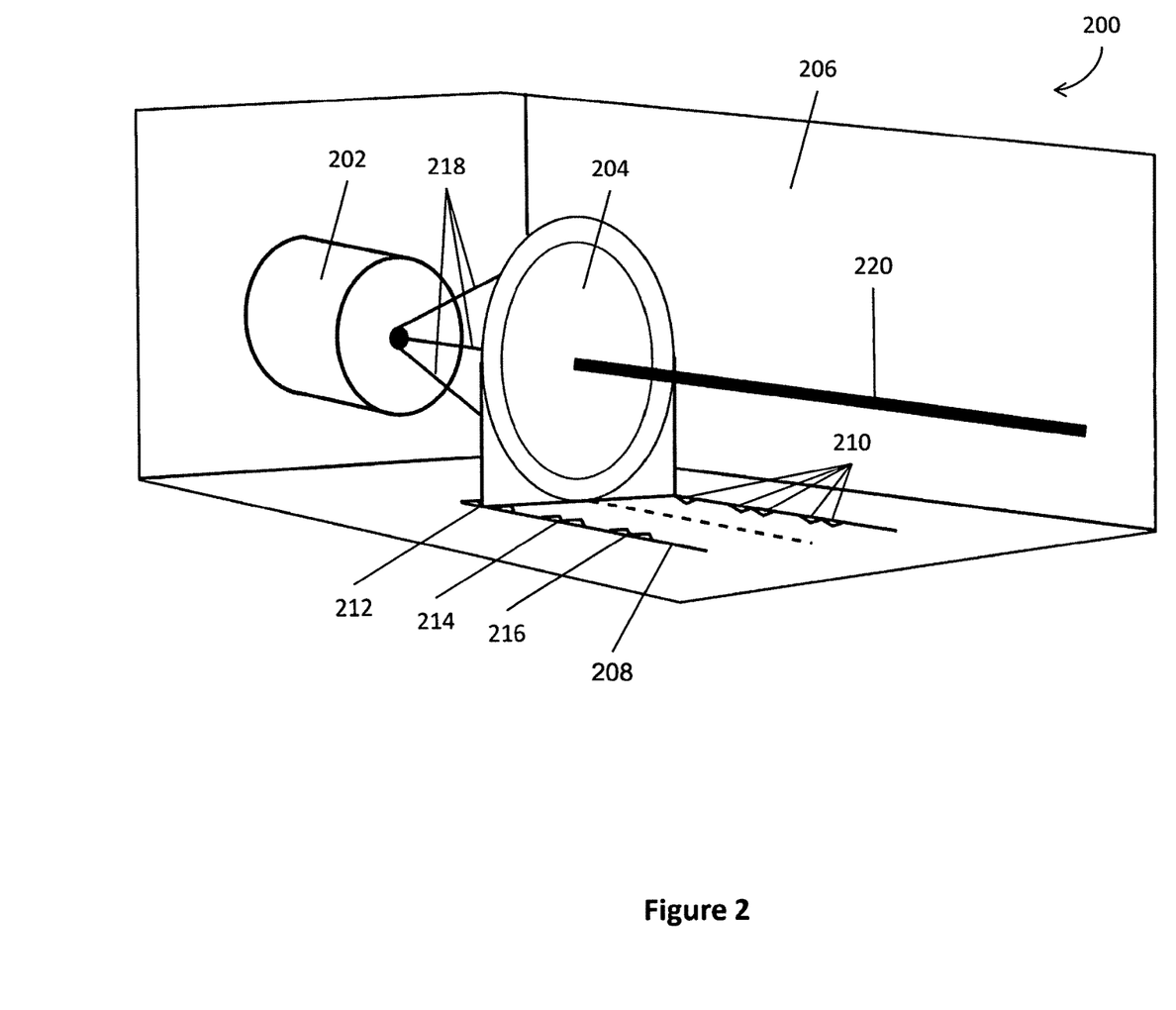
FIG. 2 is a configuration of the aiming and target identification military device.

FIG. 2 shows a device 200 that includes a laser diode 202, a non-achromatic collimator 204 (if an achromatic collimator is used, then different positions would not be required because the focal lengths would be the same), a housing 206 (shown cutaway), a positioning mechanism 208, and detents 210 along the positioning mechanism 208 to hold the non-achromatic collimator 204 in a first position 212, a second position 214, and a third position 216. The laser diode can project two, three, or more different wavelengths of electromagnetic radiation (EMR). The laser diode 202 projects any one of ultraviolet light, visible light or infrared light, selectable by the operator.

To take into account that different wavelengths of EMR emitted from the laser diode 202 could each have different focal lengths, the positioning mechanism 208 has detents 210 that hold the collimator in three different positions 212, 214, and 216. Each position 212, 214, and 216 is configured to enable the non-achromatic collimator 204 to collimate different wavelengths of EMR emitted from the laser diode 202 (the EMR is represented by the lines designated as 218) into a collimated beam 220.

Figure 5:
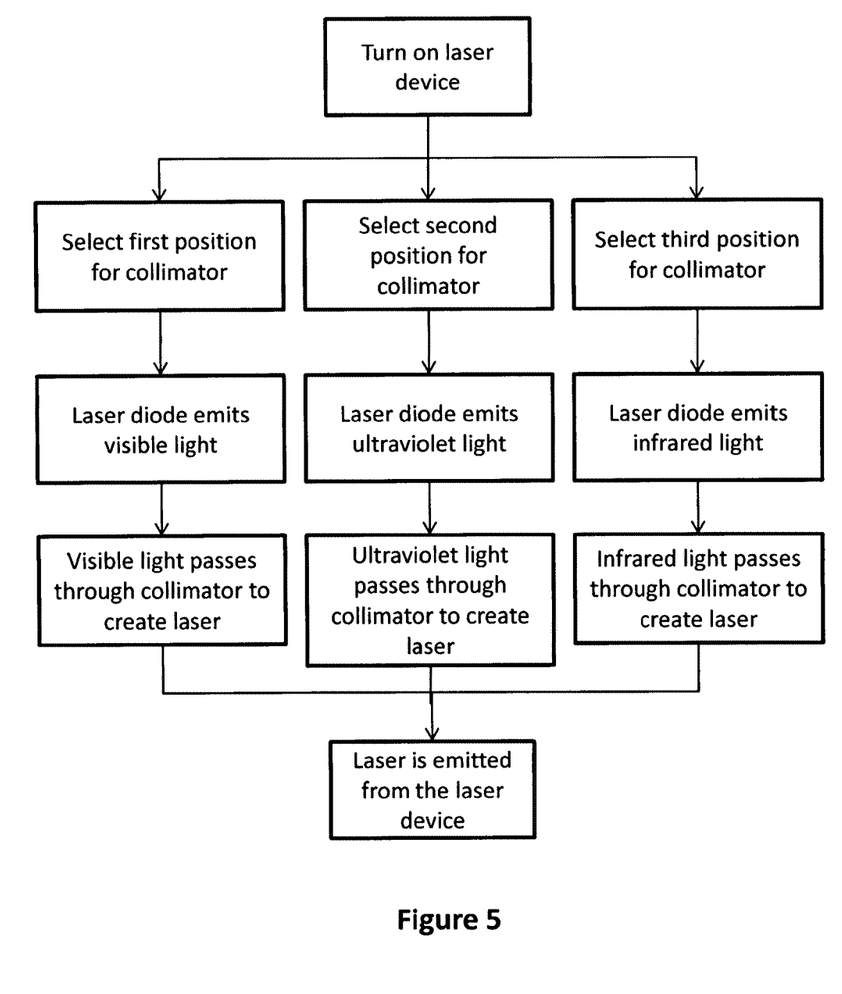
FIG. 5 is a flow diagram showing the function of the embodiment of the aiming and target identification military device.

While the non-achromatic collimator 204 can be moved manually or under electronic control. For example, the non-achromatic collimator 204 can be moved manually via a component that extrudes from the housing 206, or it can be moved automatically by an electronic motor or other means of generating lateral movement. A control system can likewise be implemented that enables the non-achromatic collimator 204 to move to and from the laser diode 202 by means of a button press or other electronic trigger. In coordination with movement of the non-achromatic collimator 204, the laser diode 202 can be electronically controlled to change the wavelength of EMR that it emits based on the position of the non-achromatic collimator 204. The trigger can be located on a surface of the laser device so that a user of the laser device can rotate the compound collimator using the trigger. When the non-achromatic collimator 204 is in the first position 212, the laser diode can be electronically controlled to emit a first wavelength of EMR, and so on for the second position 214 and third position 216. In this way, the non-achromatic collimator 204 can create a laser beam 220 from the EMR emitted from the laser diode 202 that can emit multiple wavelengths of EMR from a single source location. An example of a method that links the position of the achromatic collimator 204 to the EMR emitted from the laser diode 202 can be seen in FIG. 5.

Figure 3:
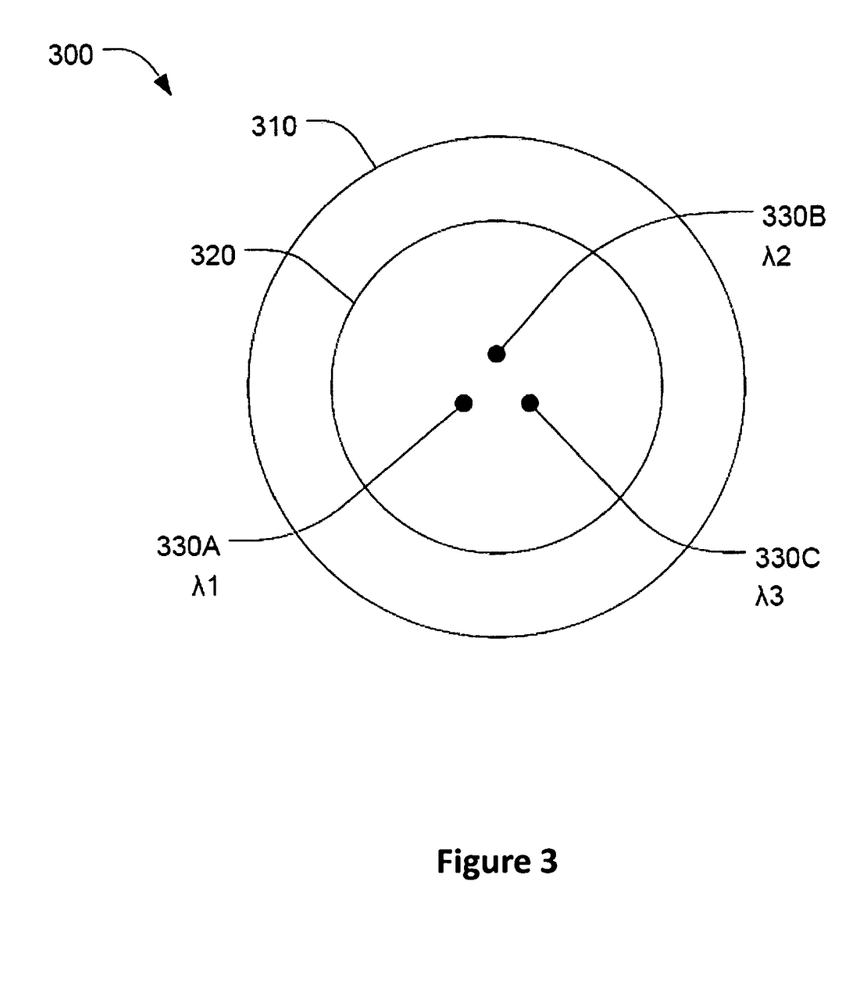
FIG. 3 is a representation of a laser diode.

FIG. 3 is an end view of a laser diode 300. A package 310 includes a window 320 that is transparent to the different wavelengths (e.g., ultraviolet/violet, red/green, and infrared wavelengths) of two, three, or more solid-state light emitters mounted within the package. The window 320 may be made from, for example, quartz, fused silica, sapphire, and certain types of optical glass. The emitting areas 330A, 330B, 330C of the three solid-state light emitters may be arranged, for example, in a triangular pattern (as shown) or a linear array. The emitting areas 330A, 330B, 330C of the three solid-state light emitters may be coplanar, which is to say disposed in a common plane. U.S. Pat. No. 6,956,322 provides internal structural details of a contemplated three-wavelength light emitter, which is incorporated herein by reference.

Referring back to FIG. 1, the collimator 120 may convert optical energy 116 emitted by the laser diode 110 into a beam 125 output from the laser device 100. The term "collimator" is intended to include any optical system capable of collimating light emitted from a point source and is not limited to combinations of transparent refractive optical elements. The collimator 120 may use refractive, diffractive, and/or reflective optical elements and combinations thereof. The collimator 120 may be implemented by a single refractive optical element such as a molded spherical or aspheric lens, in which case the collimator 120 may have a different focal length for each of the three wavelengths emitted by the laser diode 110. The collimator 120 may be achromatized, which is to say the collimator may be designed to have the same, or nearly the same, focal length for each of the three wavelengths emitted by the laser diode 110.

The power supply 130 provides regulated power to the laser diode 110. The voltage and/or current of the regulated power provided to the laser diode 110 may be different for each of the three light emitters within the laser diode 110. The voltage and/or current of the regulated power provided to the laser diode 110 may be adjusted in consideration of operational conditions, such as ambient light level and/or the reflectivity of a target. The power supply 130 may receive power from a power source such as a battery, which is not shown.

Optionally, a portion 118 of the optical energy 116 emitted by the laser diode 110 may be detected by a sensor 140. The sensor 140 may provide a feedback signal 142 to the power supply 130. A module (not shown) in the power supply may vary the amount of power provided by the power supply as a function of the feedback signal 142 such that the source emits a desired amount of optical energy 116 when variations in temperature and other factors may require more, or less, power output.

The sensor 140 may include one, two, or three photodiodes or other solid state detectors to measure the optical power in the portion 118 of the optical energy emitted by the source 110. The portion 118 may be a known fraction (not necessarily the same fraction for each of the three light emitters) of the optical energy 116 emitted by the laser diode 110, such that measuring the portion 118 indirectly measures the absolute power of the optical energy 116. The portion 118 may be an unknown fraction of the optical energy 116 emitted by the laser diode 110. In this case the feedback 142 from the sensor 140 may be used to regulate the output from the laser diode 110 without knowing the absolute power of the optical energy 116. Although shown as a separate functional block in FIG. 1, the sensor 140 may be physically integrated into the package 112 containing the laser diode 110.

The positioning mechanism 150 may adjust a position of the collimator 120 and/or the laser diode 110 such that a direction of the beam 125 output from the laser device 100 is parallel to a reference direction 165 for all three wavelengths emitted by the laser diode 110. The function of the positioning mechanism will be discussed in further detail subsequently. The positioning mechanism 150 may adjust the position of the collimator 120 and/or the laser diode 110 using one or more electromechanical actuator, such as a motor coupled to a fine pitch screw or a solenoid. The positioning mechanism 150 may adjust the position of the collimator 120 and/or the laser diode 110 using one or more pneumatic, hydraulic, or shape memory actuators. The positioning mechanism 150 may adjust the position of the collimator 120 and/or the laser diode 110 using a mechanical apparatus, such as a cam or linkage actuated by a user of the triple-wavelength target identification device. For example, as will be discussed subsequently, the wavelength selector 160 may comprise a rotary switch operated by the user. In this case, the rotation of the switch could adjust the position of the collimator 120 and/or the laser diode 110 via a rotary cam or other mechanical linkage. The positioning mechanism 150 may adjust the position of the collimator 120 and/or the laser diode 110 in some other manner.

The wavelength selector 160 determines which one of the three light emitters is active based on one or more operator actions such as actuating a rotary switch or activating one or more buttons or keys on a control panel (not shown). The control panel may be a portion of the laser device 100 or may be coupled to the laser device via a wired or wireless communications link (not shown). The wavelength selector 160 controls the operation of the other functional blocks of the of the laser device 100.

After the operator has selected one of the three light emitters in the source 110 for operation, the power supply 130 is controlled to provide the appropriate power for the selected light emitter. The voltage and/or current provided from the power supply 130 to the source 110 may be different for each of three light emitters. In the case where two or more detectors are provided in the sensor 140, the appropriate detector is selected to provide the feedback signal. As will be discussed further with respect to FIG. 3 through FIG. 6, the positioning mechanism 160 is controlled to adjust the relative positions of the collimator 120 and the selected light emitter.

Figure 10:
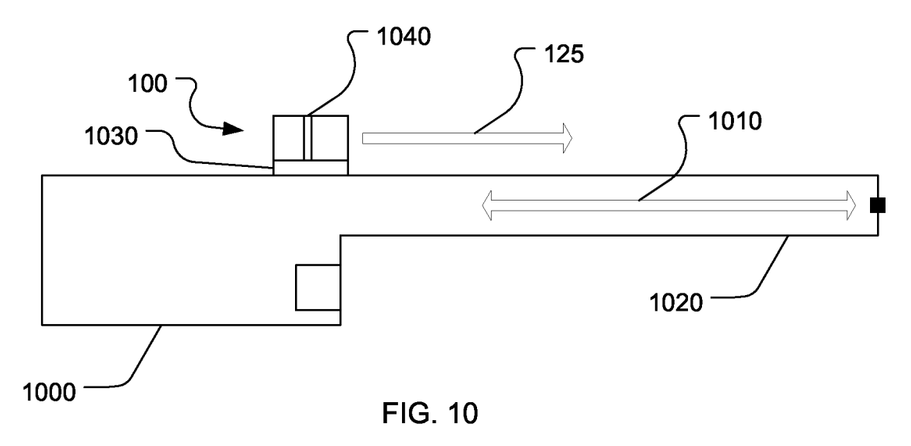
FIG. 10 shows a firearm with an aiming and target identification device.

The laser device 100 may include a pointing mechanism 170 to adjust the reference direction 165 with respect to an external reference. For example, the laser device 100 may be mounted to a firearm 1000 (FIG. 10) such as a rifle. In this case the pointing mechanism 170 may rotate the reference direction 165 with respect to the bore axis 1010 of the weapon's barrel 1020. The pointing mechanism 170 may include an elevation adjustment 1030 and a windage adjustment 1040. The elevation adjustment 1030 may be used to depress the reference direction 165 and the direction of the collimated beam 125 with respect to the bore axis 1010 of the barrel 1020 as a function of range to a target to compensate for the effect of gravity on the projectile fired from the weapon. The windage adjustment 1040 may be used to adjust the reference direction 165 and the direction of the collimated beam 125 laterally with respect to the bore axis 1010 of the barrel 1020 to compensate for the effect of cross-wind on the projectile fired from the weapon.

The laser device 100 may include a viewing subsystem 180 to assist the operator in viewing where the collimated beam 125 intersects a target. The viewing subsystem 180 may include a telescope for viewing the target using ambient illumination. The viewing subsystem 180 may include a night vision device for viewing the target at night. The axis of each of the telescope and the night vision device may be aligned parallel to the reference direction 165. Each of the telescope and the night vision device may present or display a reticule that shows where the axis of the viewing device, and thus the reference direction, intersects a target.

Ideally, the collimated beam 125 is parallel to the reference direction 165 and the axis of the viewing subsystem 180, independent of which of the three light sources is selected. In this case, the collimated beam will intersect the target at the position indicated by the reticule provided by the viewing subsystem 180.

As shown in FIG. 3, the emitting points 330A, 330B, 330C of the three light emitters in a laser diode 300 might not be collocated, i.e., only one of the three emitting points is disposed along the axis of a collimator. Light emitted from a point along the axis of a collimator will be collimated to form a beam parallel to the axis. Light emitted from points not along the axis will be collimated into beams that are not parallel to the axis. Thus, the light emitted by the three emitters 330A, 330B, 330C will be collimated into three beams that are not mutually parallel, which is to say three beams heading in different directions. The laser diode may be so small and the different emitting contained within the laser diode are so close together that small differences in the position of each emitter does not affect collimation to such a degree that correction is necessary.

Figure 4:
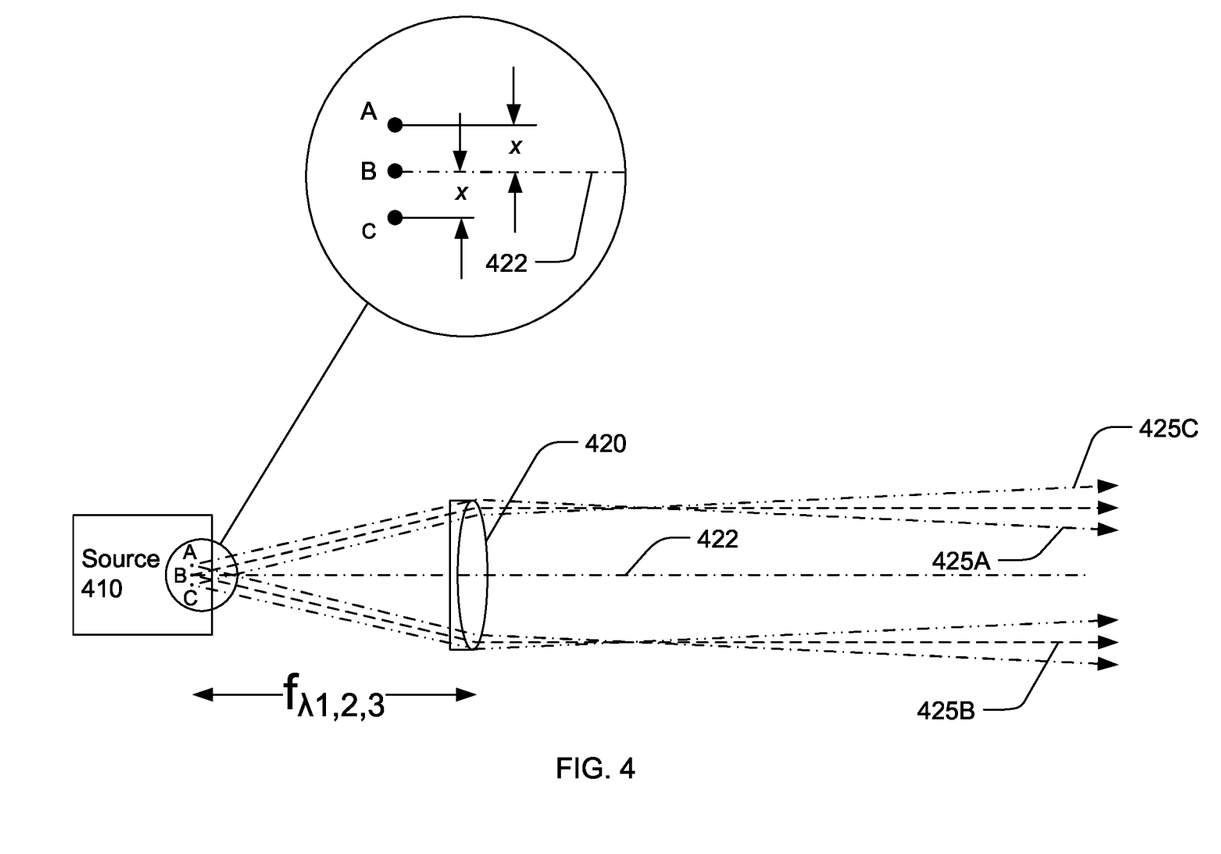
FIG. 4 is a top view of the aiming and target identification military device.

For example, as illustrated in FIG. 4, assume that a triple-wavelength source 410 contains three sources A, B, C disposed in a plane orthogonal to an optical axis 422 of an achromatic collimator 420. Source B is disposed along the optical axis 422 and source A and C are displaced from the optical axis 422 by a distance x. In this example, a collimated beam 425B formed when light source B is emitting will be parallel to the optical axis 422. Collimated beams 425A and 425C formed when light source A and C, respectively, are emitting will not be parallel to the optical axis. Collimated beams 425A and 425C will deviate from the optical axis by angles of approximately +x/f, where f is the focal length of the achromatic collimator 420. In this example, only the collimated beam 425B, formed when light source B is emitting, will intersect the target at the position indicated by the reticule provided by the viewing subsystem 180. Note that the achromatic collimator 420 in FIG. 4 is achromatic, which is to say the focal length f of the achromatic collimator 420 is essentially the same for each of the three wavelengths 21, 22, and 23 emitted by the triple-wavelength source 410. If the achromatic collimator 420 was not achromatic, only one of the three beams 425A, 425B, and 425C would be collimated. The other two beams would be either converging or diverging.

A target identification device such as the target identification device 100 may be used as a target designator to identify a target to a guided projectile that can detect and home-in on light reflected from the target. A target identification device such as the target identification device 100 may be mounted to rifle or other weapon and used as a sight to help the operator aim the weapon. In either application, the angular difference between the three emitted must be either eliminated or compensated.

Figure 6:
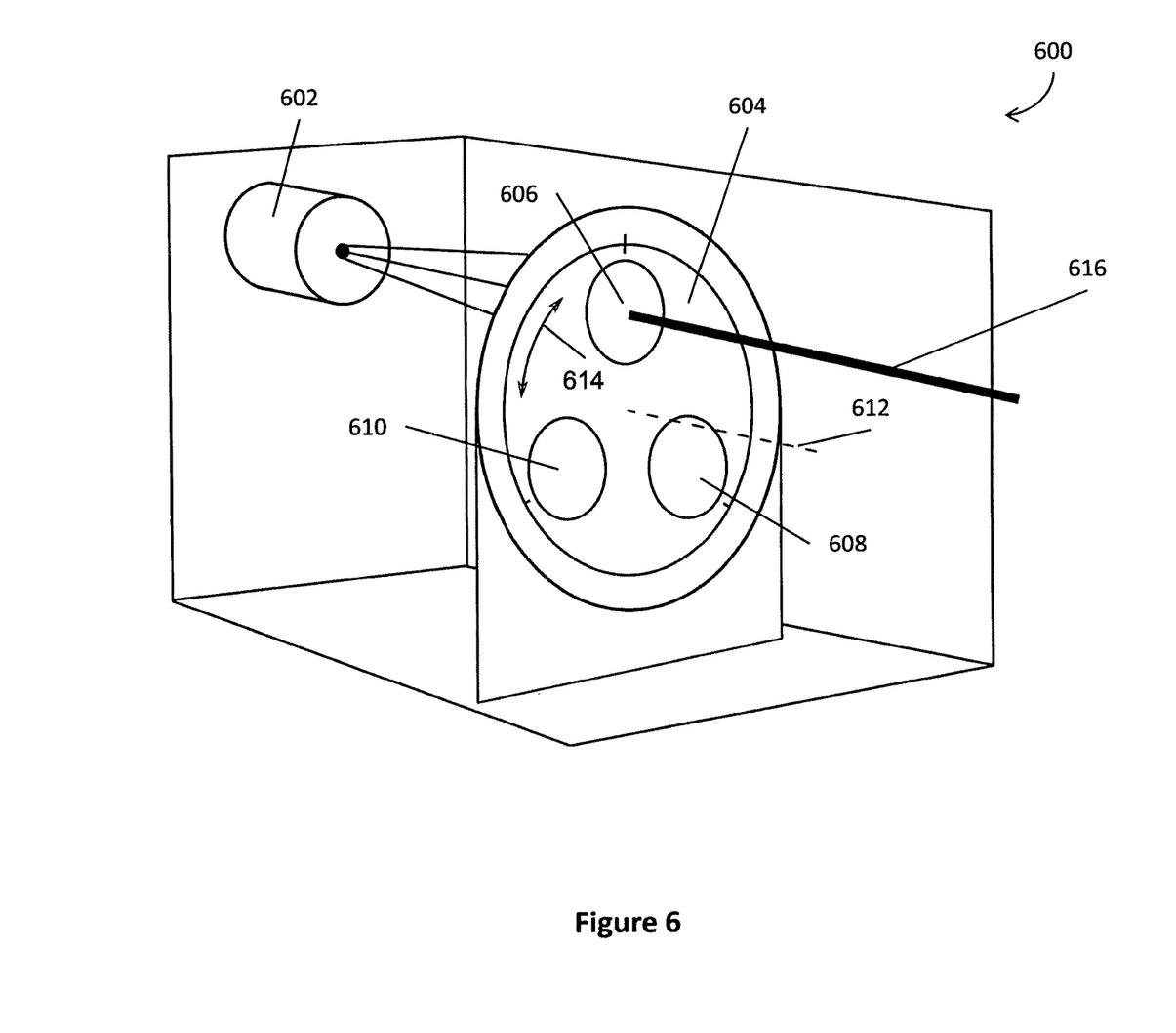
FIG. 6 shows an alternative configuration of the aiming and target identification military device.

FIG. 6 shows a device 600 having a laser diode 602 that emits EMR into a compound collimator 604. The compound collimator 604 includes three different non-achromatic collimators 606, 608, & 610 disposed around a central axis of rotation 612. The collimators 606, 608, & 610 are designed to collimate three different wavelengths of EMR emitted from the laser diode 602. When the laser diode generates an emission of, for example, visible light, one region of the collimator can collimate a first wavelength into a first laser, and another region of the collimator can collimate a second wavelength into a second laser, and so on for each of the other collimators on the compound collimator. By having equal focal lengths, the compound collimator can be a fixed distance from the laser diode.

Regardless of the number of collimators required to be disposed on the compound collimator 604, the laser diode 602, as mentioned above with respect to FIG. 3, can include three different emitters that are separated by some amount of distance. To ensure the most accurate laser beam 616 possible (e.g., a laser that points in a direction that is in line with the emitter and collimator without any angular distortion as described with respect to FIG. 4), the non-achromatic collimators 606, 608, & 610 can be positioned on the compound collimator 604 such that as the compound collimator 604 is rotated, the different non-achromatic collimators 606, 608, & 610 are positioned directly in front of the respective emitter within the laser diode 602. Such a configuration could ensure that each different collimator can be properly positioned in front of the laser diode. Variations in position between the different collimators when they are in front of the laser diode can be as small as a few microns, depending on the separation distances between each of the individual emitters within the laser diode 602. Such positioning adjustments can similarly be implemented with non-achromatic collimators to further improve accuracy of the resulting laser beam.

As shown by arrows 614 the compound collimator 604 is designed to be rotated about the axis of rotation 612 to bring each different collimator 606, 608, & 610 into action. A rotating mechanism can additionally be included to enable a user to rotate the compound collimator 604 manually (e.g., a component that extrudes from the housing to enable manual manipulation by a laser device's user). The rotating mechanism may be electronically controlled. For example, a closed loop control system can cause a stepper motor to rotate to bring each different non-achromatic collimator 606, 608, & 610 into line with the laser diode 602. An electronically controlled system can be manipulated by button press or by software that communicates with the laser device 600 (e.g., via a wired or wireless connection).

The collimators on the compound collimator 604 may be achromatic, meaning the collimators can focus a broad spectrum of EMR wavelengths at a single focal length unlike non-achromatic collimators. The rotating compound collimator 604 can include three identical collimators located around the axis of rotation 612 at slightly different positions to take into account slight differences in the position of each different EMR emitter within the laser diode 602. This approach can increase the accuracy of the laser beam 616 emitted by the laser device.

The compound collimator can also include a locking or holding mechanism to enable it to "click" into different angular positions. The act of a user switching the compound collimator from one position to another triggers a command signal to be sent to the laser diode to emit the corresponding wavelength of light. Switching the wavelength of EMR the laser diode emits can be accomplished automatically based on the angular position of the compound collimator. This can be accomplished using detents, a ratcheting mechanism, or by any other suitable locking or holding mechanism. The end result, regardless of the mechanism implemented, is that the different collimators 606, 608, & 610 should be properly positioned in front of the laser diode 602 when the compound collimator locks into an angular position.

Figure 7:
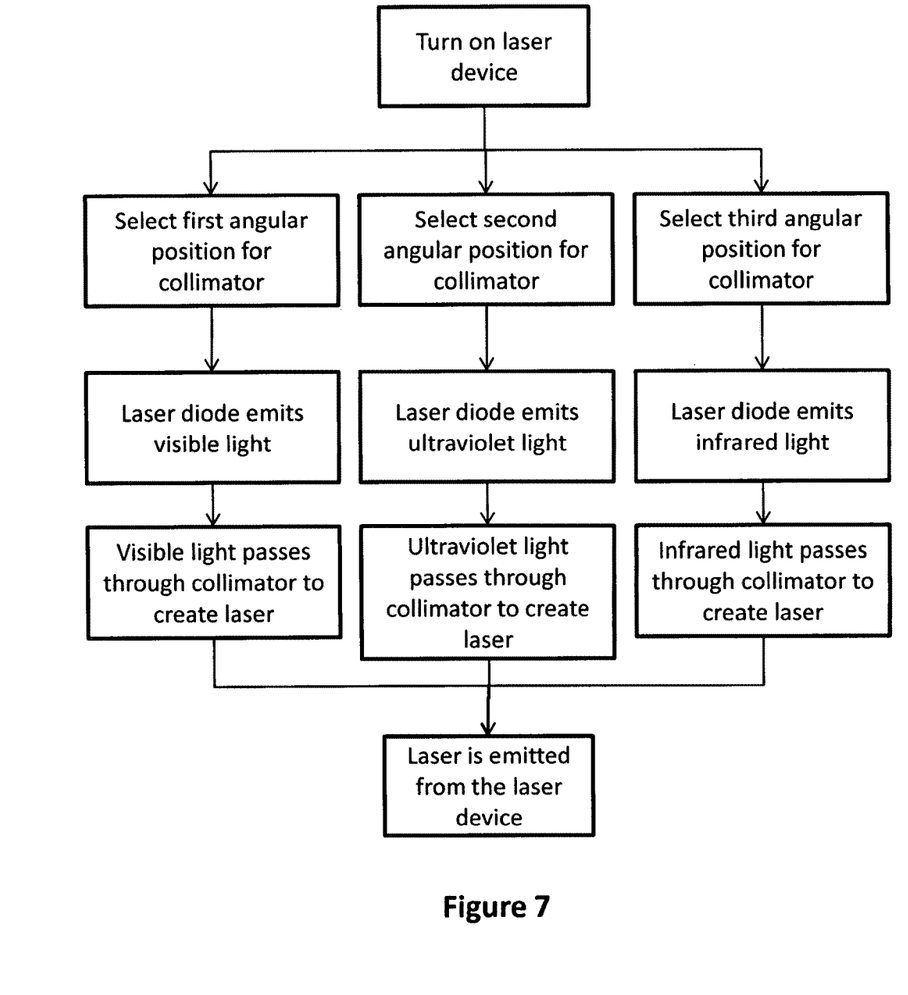
FIG. 7 is a flow diagram of functions of the device.

FIG. 7 shows an exemplary method of using the device that implement a rotating compound collimator can function to select which wavelength of EMR is emitted from the laser diode. By rotating the compound collimator into different angular positions, the laser diode can be caused to emit only the correct corresponding wavelength EMR. A "correct" corresponding wavelength EMR can depend on the position of the emitter within the laser diode (e.g., to compensate for slightly different emitter positions), and it can also depend on the wavelength of the EMR emitted from the laser diode (e.g., when non-achromatic collimators are used).

Figure 8A:
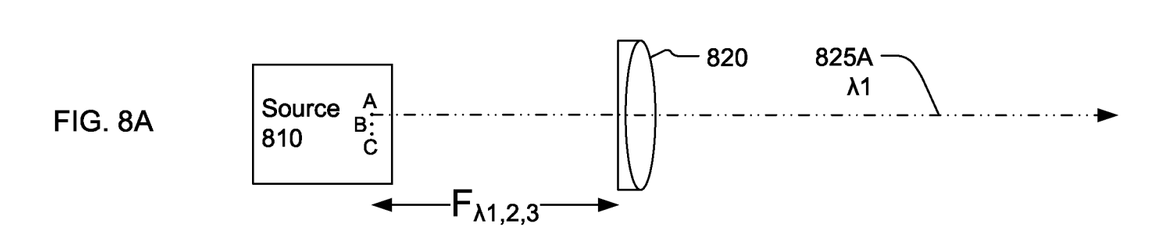
FIG. 8A, FIG. 8B, and FIG. 8C are optical schematic diagrams of an aiming and target identification military device.
Figure 8B:
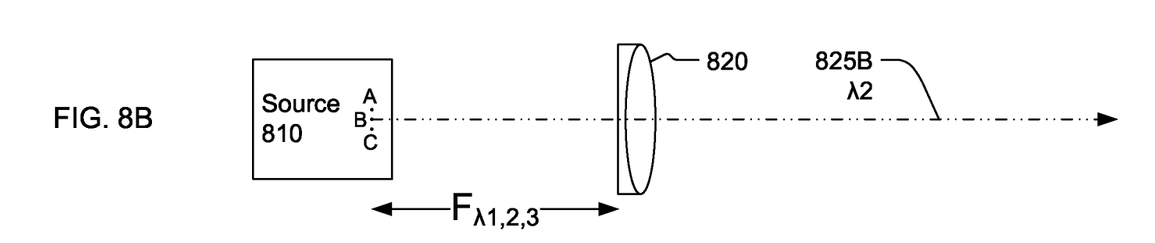
Figure 8C:
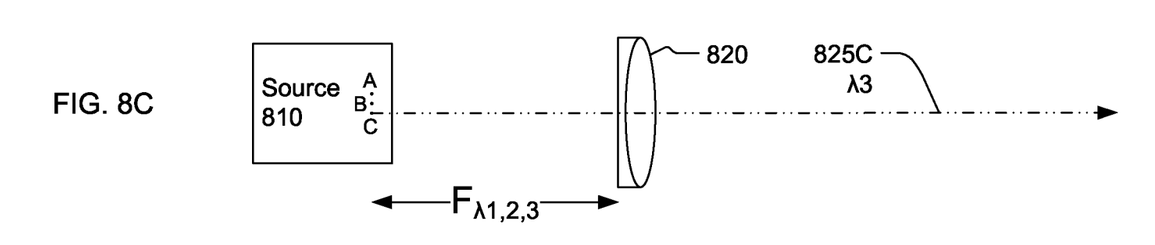

FIGS. 8A, 8B, and 8C show how the differences in emitter positions can be compensated for by adjusting collimator positions. Essentially, the resulting angular difference between the three beams emitted by emitter that are not perfectly coincidental may be eliminated by moving an achromatic collimator 820 or a laser diode 810 laterally such that an optical axis of the collimator 820 passes through the active emitter within the laser diode 810. As shown in FIG. 8A, when source A is emitting, the relative position of the laser diode 810 and collimator 820 are adjusted such that the optical axis passes through source A such that collimated beam 825A is directed parallel to the optical axis. As shown in FIG. 8B, when source B is emitting, the relative position of the laser diode 810 and collimator 820 are adjusted such that the optical axis passes through source B such that collimated beam 825B is directed parallel to the optical axis. As shown in FIG. 8C, when source C is emitting, the relative position of the laser diode 810 and collimator 820 are adjusted such that the optical axis passes through source C such that collimated beam 825C is directed parallel to the optical axis. Although FIGS. 8A, 8B, and 8C show an achromatic collimator, the same effect can be achieved with non-achromatic collimators by using, for example, a rotating compound collimator that brings each different non-achromatic collimator into the correct position relative to the laser diode 810 as described above.

The relative positions of the triple wavelength laser diode 810 and the collimator 820 may be adjusted by the operator actuating a lever or control that moves either the triple wavelength laser diode 810 or the collimator 820 to the appropriate one of three predetermined positions via a cam or other mechanical linkage. The triple wavelength laser diode 810 or the collimator 820 may be moved between the three predetermined positions automatically, which is to say in response to the operator setting an electrical switch (which may also control the power supply and other functional elements of the target identification device). The triple wavelength laser diode 810 or the collimator 820 may then be moved by an actuator such as a solenoid or motor controlled by the electrical switch. The triple wavelength laser diode 810 or the collimator 820 may be moved in some other manner.

Figure 9A:
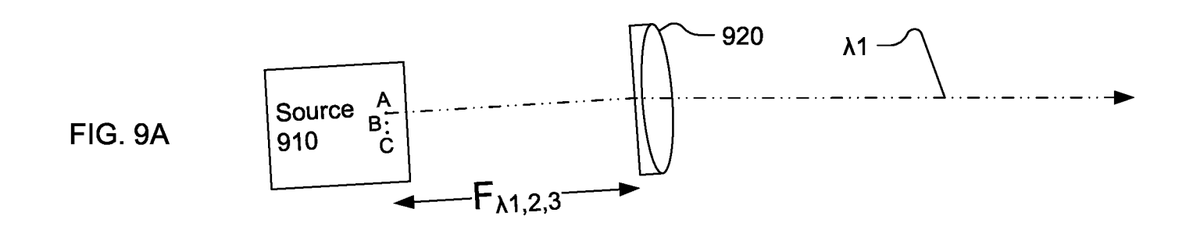
FIG. 9A, FIG. 9B, and FIG. 9C are optical schematic diagrams of another an aiming and target identification military device.
Figure 9B:
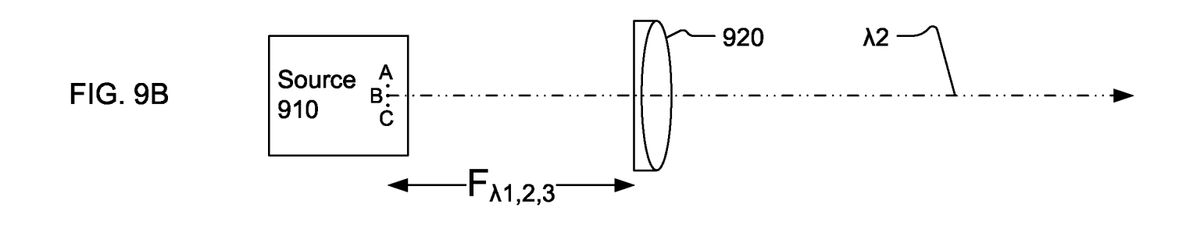
Figure 9C:
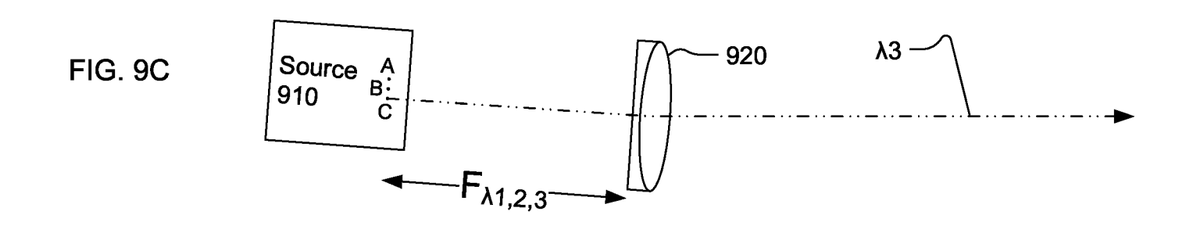

FIG. 9A, FIG. 9B and FIG. 9C illustrate another technique to compensate for the angular difference between the three emitted beams that would result from implementing a fixed position collimator 920 with a fixed position laser diode 910. The three collimated beams from the three light emitters are not mutually parallel or necessarily parallel to the axis of the collimator. The angular differences between the three collimated beams are compensated by rotating the collimator 920 and the triple-wavelength source 910 as an assembly such that the collimated beam is aimed in the same direction when any one of the three light emitters is active. The rotation of the collimator 920 and the laser diode 910 as an assembly may be accomplished by the positioning mechanism 150, which may also be used for distance and windage compensation. Basically, compensation for the angular difference between the three emitted beams can be accomplished by redefining the "zero elevation" and "zero windage" settings of the pointing mechanism.

CLOSING COMMENTS

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. An aiming device for a firearm comprising:
   a housing adapted to be affixed to the firearm;
   a package affixed in the housing and comprising a first light emitter, a second light emitter and a third light emitter, wherein the first light emitter, the second light emitter and the third light emitter are separate, and wherein the first light emitter, the second light emitter and the third light emitter are configured to emit light along an optical axis in alignment with a bore axis of a barrel of the firearm, wherein the first light emitter is configured to emit visible light, the second light emitter is configured to emit infrared light, and the third light emitter is configured to emit ultraviolet light;
   a collimator affixed in the housing and configured:
   to collimate the visible light at a first distance from a point on the package,
   to collimate the infrared light at a second distance from the point, and
   to collimate the ultraviolet light at a third distance from the point;
   wherein the collimator causes the visible light to be collimated into a first laser beam at the first distance passing through the collimator, the collimator causes the infrared light to be collimated into a second laser beam at the second distance passing through the collimator, and the collimator causes the ultraviolet light to be collimated into a third laser beam at the third distance passing through the collimator;
   a positioner to position the collimator under operator control at any one of a first position, a second position and a third position, wherein the first position corresponds to the first distance, the second position corresponds to the second distance, and the third position corresponds to the third distance;
   wherein only one of the light emitters generates light at a time; and
   wherein the light emitters and the collimator are adapted such that:
   the first light emitter generates the visible light if the collimator is in the first position,
   the second light emitter generates the infrared light if the collimator is in the second position, and
   the third light emitter generates the ultraviolet light if the collimator is in the third position.

2. The aiming device of claim 1 wherein a plurality of detents hold the collimator at the first, second, and third positions.

3. The aiming device of claim 1 further comprising a selector for controlling which of the first, second, and third light emitters is active, wherein the aiming device is adapted to adjust the collimator to the first position if the first solid-state light emitter is active, to the second position if the second solid-state light emitter is active, and to the third position if the third solid-state light emitter is active.

4. The aiming device of claim 1 wherein the collimator includes multiple collimating regions.

5. The aiming device of claim 1 wherein the first light emitter, the second light emitter and the third light emitter each emits light of a respective single wavelength.

6. The aiming device of claim 1 wherein the ultraviolet light has a wavelength which is one of invisible ultraviolet wavelength and barely-visible violet wavelength.

7. The aiming device of claim 1 wherein the light emitters are arranged in one of a triangular pattern and a linear array.

8. The aiming device of claim 1 wherein the light emitters have respective emitting areas which are coplanar with one another.

9. The aiming device of claim 1 wherein the collimator is non-achromatic.

10. The aiming device of claim 1 further comprising an elevation adjustment affixed to the housing and a windage adjustment affixed to the housing.

* * * * *